(12) United States Patent
Ogasawara et al.

(10) Patent No.: US 8,238,181 B2
(45) Date of Patent: Aug. 7, 2012

(54) SEMICONDUCTOR DEVICE, CIRCUIT OF CONTROLLING SIGNAL LINES AND METHOD OF CONTROLLING SIGNAL LINES

(75) Inventors: Tomohiro Ogasawara, Tokyo (JP); Kiyotake Sakurai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 254 days.

(21) Appl. No.: 12/694,725

(22) Filed: Jan. 27, 2010

(65) Prior Publication Data
US 2010/0195417 A1 Aug. 5, 2010

(30) Foreign Application Priority Data
Jan. 28, 2009 (JP) .................. P2009-016702

(51) Int. Cl.
*G11C 7/00* (2006.01)
(52) U.S. Cl. ..................... 365/202; 365/204

(58) Field of Classification Search .................. 365/202, 365/204, 206, 203
See application file for complete search history.

(56) References Cited

U.S. PATENT DOCUMENTS

| | | | | |
|---|---|---|---|---|
| 6,023,437 A | * | 2/2000 | Lee ................ | 365/203 |
| 6,049,493 A | * | 4/2000 | Kitamoto et al. ...... | 365/203 |
| 6,097,652 A | * | 8/2000 | Roh ................ | 365/205 |
| 6,347,057 B1 | * | 2/2002 | Matsui ............... | 365/203 |
| 2002/0057622 A1 | * | 5/2002 | Sim ................ | 365/230.03 |

FOREIGN PATENT DOCUMENTS
JP 2005-340367 A 12/2005
* cited by examiner

*Primary Examiner* — Vu Le
(74) *Attorney, Agent, or Firm* — Sughrue Mion, PLLC (57) ABSTRACT

A semiconductor device includes first and second lines, and a switch between the first and second lines. The switch temporary and electrically connects the first and second lines to each other, when the first signal line is transitioned from a first level to a second level while the second signal line is transitioned from the second level to the first level.

16 Claims, 4 Drawing Sheets

SEMICONDUCTOR DEVICE, CIRCUIT OF CONTROLLING SIGNAL LINES AND METHOD OF CONTROLLING SIGNAL LINES

BACKGROUND OF THE INVENTION

1. Field of the Invention

The present invention generally relates to a semiconductor memory device, a circuit of controlling signal lines, and a method of controlling signal lines. Priority is claimed on Japanese Patent Application No. 2009-16702, Jan. 28, 2009, the content of which is incorporated herein by reference.

2. Description of the Related Art

Japanese Unexamined Patent Application, First Publication, No. JP-A-2005-340367 discloses a shared-sense amplifier circuit in a DRAM. The shared-sense amplifier circuit is configured to suppress power consumption in a boosting circuit by making the precharge signal inside a shared switch MOSFET lower than a boosting voltage.

SUMMARY

In one embodiment, a semiconductor device may include, but is not limited to, first and second lines, and a switch between the first and second lines. The switch temporary and electrically connects the first and second lines to each other, when the first signal line is transitioned from a first level to a second level while the second signal line is transitioned from the second level to the first level.

In another embodiment, a device may include, but is not limited to, a memory mat comprising first and second bit lines; an amplifier circuit coupled to the first and second bit lines; a control portion generating first and second signals; and first and second signal lines supplied respectively with the first and second signals. The first and second bit lines is electrically coupled to each other during a first time period in which the first signal takes a first logic level and the second signal takes a second logic level. The first and second bit lines is electrically decoupled from each other during a second time period in which the first signal takes the second logic level and the second signal takes the first logic level. The first and second bit lines are electrically decoupled from the amplifier circuit during the first time period. The first and second bit lines are electrically coupled to the amplifier circuit during the second time period. The first and second signal lines are electrically coupled to each other during a third period in at least one of the first and second time periods from a timing when at least one of the first and second signals change from one of the first and second logic level to the other thereof.

In still another embodiment, a method of controlling signal lines may include, but is not limited to, temporary causing a short-circuit current between first and second lines, when the first signal line is transitioned from a first level to a second level while the second signal line is transitioned from the second level to the first level.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIGS. 3 and 4, in order to facilitate the understanding of the present invention.

Figure 3:
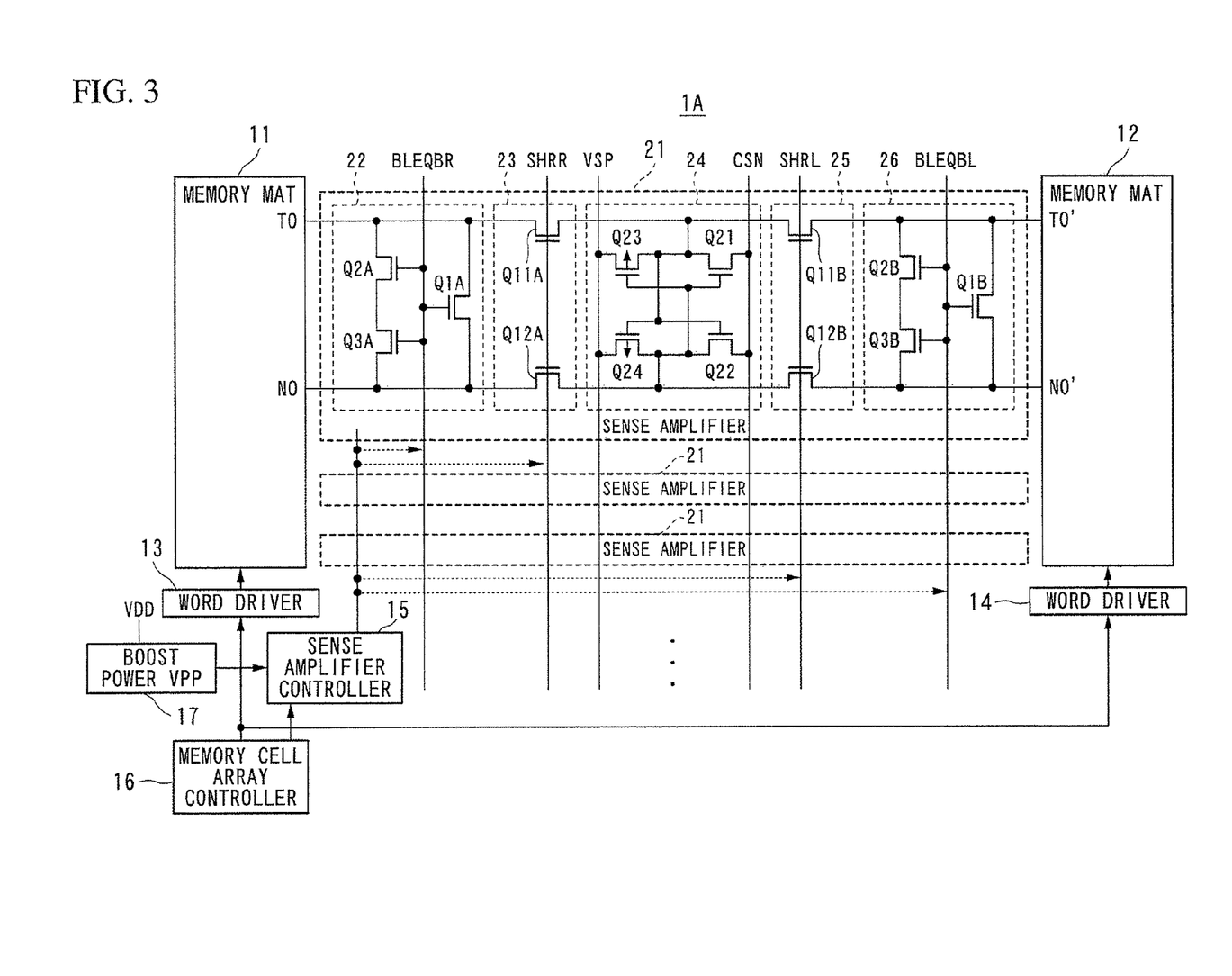
FIG. 3 is a diagram illustrating the configuration of a semiconductor memory device such as a DRAM which is well known in the related art.

FIG. 3 is a diagram illustrating the configuration of a semiconductor memory device 1A such as a DRAM which is well known in the related art. The configuration of a semiconductor memory device shown in FIG. 3 is a well-known configuration, but the basic constituent parts thereof are the same as the embodiment of the invention described later. Since they are used for the purpose of comparison of the configuration and the like in the description of the embodiment, the configuration and operation thereof will be described herein.

In the semiconductor memory device 1A shown in FIG. 3, memory mats (memory cell arrays) 11 and 12 are disposed in both sides of a shared type sense amplifier circuit 21. The semiconductor memory device 1A is configured to cause the sense amplifier circuit 21 to be shared in two memory mats 11 and 12 by connecting a pair of bit lines T0 and N0 (and T0' and N0') of each of the memory mats 11 and 12 to the common sense amplifier circuit 21. Herewith, the number of the sense amplifiers is reduced, to thereby achieve high-density integration of the semiconductor memory device.

The semiconductor memory device 1A includes word drivers 13 and 14 for selecting a memory cell within the memory mats 11 and 12. Further, a memory cell array control section 16 generates signals that control the word drivers 13 and 14, and issues control commands (Active command, Precharge command and the like) to a sense amplifier control section 15. The sense amplifier control section 15 uses commands from the memory cell array control section 16 as an input, and generates various types of control signals (bit line precharge signals BLEQBR and BLEQBL, shared signals SHRR and SHRL or the like) which are used in the sense amplifier circuit 21. Meanwhile, signal lines VSP (source of sense amplifier P-channel side) and CSN (source of sense amplifier N-channel side) have no particular relationship to the invention, therefore the description thereof is omitted.

The bit lines T0 and N0 connected to the memory mat 11 shown in the left side of the drawing are precharged to a predetermined voltage level by a precharge section 22 composed of N-channel MOS transistors Q1A, Q2A, and Q3A. The bit lines T0 and N0 are connected to a sense amplifier section 24 through a shared section 23 composed of N-channel MOS transistors Q11A and Q12A. The sense amplifier section 24 is composed of N-channel MOS transistors Q21 and Q22, and P channel MOS transistors Q23 and Q24.

A signal line of the bit line precharge signal BLEQBR is connected to gates of each of the transistors Q1A, Q2A, and Q3A of the precharge section 22, and precharge operations for the bit lines T0 and N0 are controlled in response to the bit line precharge signal BLEQBR. In addition, a signal line of the shared signal SHRR is connected to gates of each of the transistors Q11A and Q12A of the shared section 23. Control (shared control) of connection and separation between the precharge section 22 and the sense amplifier section 24 is performed in response to the shared signal SHRR.

Similarly, the bit lines T0' and N0' of the memory mat 12 shown in the right side of the drawing are precharged by a precharge section 26 composed of N-channel MOS transistors Q1B, Q2B, and Q3B. The bit lines T0' and N0' are connected to the sense amplifier section 24 through a shared section 25 composed of N-channel MOS transistors Q11B and Q12B.

A signal line of the bit line precharge signal BLEQBL is connected to gates of each of the transistors Q1B, Q2B, and Q3B of the precharge section 26, and precharge operations for the bit lines T0' and N0' are controlled in response to the bit line precharge signal BLEQBL. In addition, a signal line of the shared signal SHRL is connected to gates of each of the transistors Q11B and Q12B of the shared section 25. Control of connection and separation between the precharge section 26 and the sense amplifier section 24 is performed in response to the shared signal SHRL.

Meanwhile, the semiconductor memory device 1A includes a boosting power supply VPP17 (hereinafter, simply called "boosting power supply VPP") that generates a voltage VPP boosted from a power supply VDD. The bit line precharge signals BLEQBR and BLEQBL, and the shared signals SHRR and SHRL, which are generated by the sense amplifier control section 15, become signals of levels of the voltage VPP generated by the boosting power supply VPP for the purpose of speeding up of ROW (X) based control.

Figure 4:
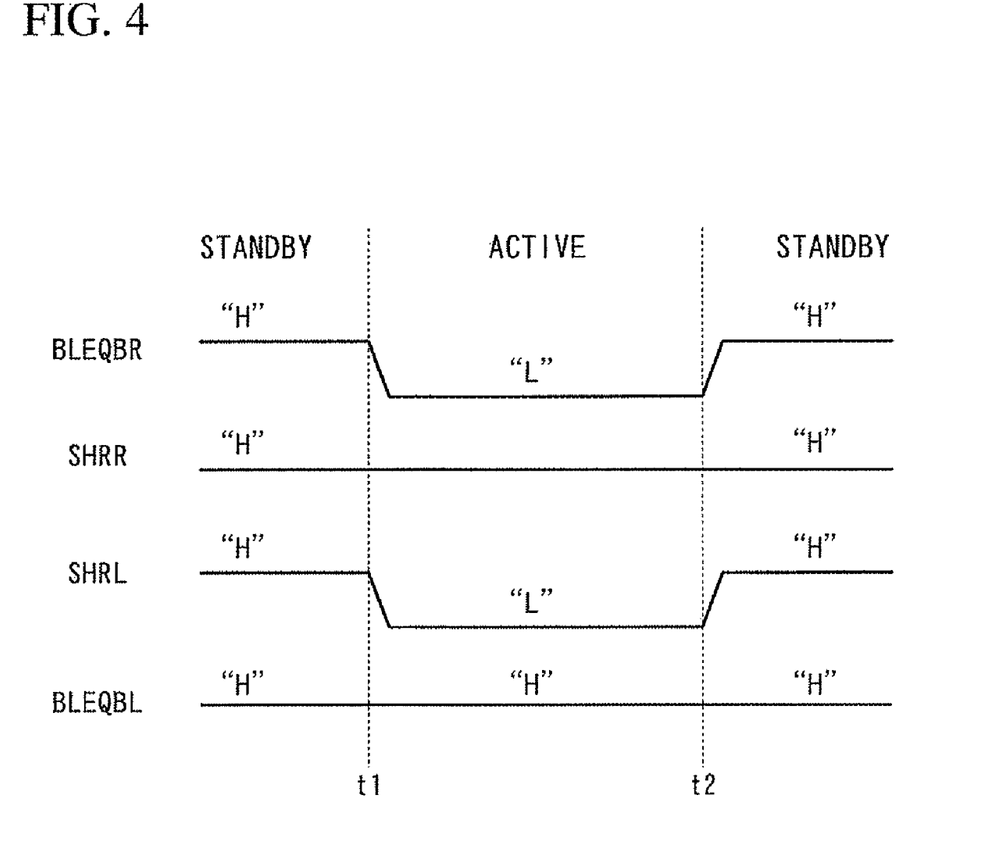
FIG. 4 is a timing chart illustrating signal waveforms to describe operations of a sense amplifier circuit included in the semiconductor memory device of FIG. 3.

FIG. 4 is a timing chart for describing an operation of the sense amplifier circuit 21 within the semiconductor memory device 1A shown in FIG. 3. In the timing chart of FIG. 4, shown, in order from above, are the bit line precharge signal BLEQBR to be input to the precharge section 22, the shared signal SHRR to be input to the shared section 23, the shared signal SHRL to be input to the shared section 25, and the bit line precharge signal BLEQBL to be input to the precharge section 26.

In FIG. 4, at time t1, the Active command for reading out data from the memory cell within the memory mat 11 is issued to the sense amplifier control section 15 from the memory cell array control section 16. The sense amplifier control section 15 and the sense amplifier circuit 21 are activated by the Active command, and enter the active period (time t1 to time t2).

When they enter the active period (time t1 to time t2) at time t1, the bit line precharge signal BLEQBR is transited from an "H" level (simply referred to as "H") to an "L" level (simply referred to as "L"), and the shared signal SHRL is transited from "H" to "L". In the meantime, the shared signal SHRR and the bit line precharge signal BLEQBL remain "H".

Herewith, at the active period (time t1 to time t2), a precharge state of the precharge section 22 of the memory mat 11 side is released, and the bit lines T0 and N0 of the memory mat 11 side and the sense amplifier section 24 are connected via the shared section 23. On the other hand, the precharge section 26 of the memory mat 12 side and the sense amplifier section 24 are separated via the shared section 25. Herewith, a signal of the memory cell selected by the word driver 13 within the memory mat 11 is input to the sense amplifier section 24 via the bit lines T0 and N0, and then data of the memory cell are read out.

Subsequently, when readout of data from the memory cell of the memory mat 11 is completed, and time t2 is reached, the Precharge command is issued from the memory cell array control section 16 to the sense amplifier control section 15. By issuing the Precharge command, after time t2, the sense amplifier circuit 21 enters the standby period (after time t2) for precharging the bit lines T0 and N0 of the memory mat 11.

As described above, in the semiconductor memory device 1A, the bit line precharge signals BLEQBR and BLEQBL, or the shared signals SHRR and SHRL that control the sense amplifier circuit 21 become signals of the voltage levels of the boosting power supply VPP for the purpose of speeding up of ROW (X) based control. However, the gates of the numerous transistors are connected to the bit line precharge signals BLEQBR and BLEQBL, or the shared signals SHRR and SHRL, and they become a heavy load with respect to the boosting power supply VPP, therefore there has been a demand to reduce power consumption in the boosting power supply VPP.

The shared-sense amplifier circuit is configured to suppress power consumption in a boosting circuit by making the precharge signal inside a shared switch MOSFET lower than a boosting voltage.

As described above, the boosting power supply VPP boosted by a charge pump circuit and the like inside the semiconductor memory device is used for the bit line precharge signal BLEQBR or the shared signal SHRR for the purpose of speeding up of ROW based control. On the other hand, the gates of numerous N-channel MOS transistors are connected to each of the signal lines of the above-mentioned bit line precharge signals BLEQBR and BLEQBL and shared signals SHRR and SHRL as a capacitive load, and become a heavy load with respect to the boosting power supply VPP. For this reason, in the signal lines of the bit line precharge signals BLEQBR and BLEQBL and the shared signals SHRR and SHRL, large current flows from the boosting power supply VPP.

The boosting power supply VPP is a power supply that performs a boosting operation from the externally-supplied power supply VDD, and becomes a power supply having inefficient current consumption due to a large loss caused with the boosting operation. For this reason, it is required to alleviate the load of the boosting power supply VPP, and to reduce power consumption. There has also been a problem of large consumption of power dissipated to drive the bit line precharge signals BLEQBR and BLEQBL and the shared signals SHRR and SHRL.

The above described matters are related to not only the signal lines of the bit line precharge signals BLEQBR and BLEQBL and the shared signals SHRR and SHRL, but also other signal lines to which currents are supplied from the boosting power supply VPP.

The invention will be now described herein with reference to illustrative embodiments. Those skilled in the art will recognize that many alternative embodiments can be accomplished using the teaching of the present invention and that the invention is not limited to the embodiments illustrated for explanatory purpose.

In one embodiment, a semiconductor device may include, but is not limited to, first and second lines, and a switch between the first and second lines. The switch temporary and electrically connects the first and second lines to each other, when the first signal line is transitioned from a first level to a second level while the second signal line is transitioned from the second level to the first level.

When the first signal line is transitioned from the first level to the second level while the second signal line is transitioned from the second level to the first level, the switch between the first and second lines temporary and electrically connects the first and second lines to each other, to cause a current through the switch between the first and second signal lines. In some cases, the first level may be higher than the second level. In other cases, the first level may be lower than the second level. Immediately after the transitions of the first and second signal lines are initiated, the first and second signal lines are in the first and second levels respectively. Immediately after the transitions of the first and second signal lines are initiated, the switch has electrically connected the first and second signal lines which have the first and second levels respectively, thereby causing a current such as a short circuit current through the switch between the first and second signal lines. The current as the short circuit current promotes the transitions of the first and second signal lines. In other words, this current causes charge redistribution between the first and second signal lines, so as to promote the transitions of the first and second signal lines. The current through the switch will reduce first and second driving currents which need to be applied to the first and second signal lines, respectively. If no current were caused through the switch between the first and second signal lines, the first and second signal lines need to be transitioned by the first and second driving currents alone without any short-circuit current. The current through the switch will cooperate with the first and second driving currents to transition the first and second signal lines. The switch between the first and second signal lines will reduce the necessary driving power to drive the first and second signal lines with applications of the first and second driving currents. It will be more effective to provide the switch between the first and second signal lines if at least one of the first and second signal lines has a larger load which needs a larger current consumption. It will also be more effective to provide the switch if the driving current for driving at least one of the first and second signal lines is supplied by a boosted power voltage.

It is assumed that in some cases the first level "H" is higher than the second level "L". In this case, the first signal line shows a first transition from the first level "H" to the second level "L" and the second signal line shows a second transition from the second level "L" to the first level "H". Immoderately after initiating the first and second transitions, the first and second signal lines are in the first level "H" and the second level "L", respectively. Immediately after initiating the first and second transitions, the switch electrically connects the first and second signal lines so as to cause a current such as a short circuit current through the switch between the first and second signal lines. The switch electrically connecting the first and second signal lines causes that the current such as the short circuit current flows from the first signal line having the first level "H" to the second signal line having the second level "L". This current promotes both the first transition of the first signal line from the first level "H" to the second level "L" and the second transition of the second signal line from the second level "L" to the first level "H". In other words, this current through the switch promotes rising the first voltage level of the first signal line and falling the second voltage level of the second signal line. In still other words, this current through the switch causes charge redistribution between the first and second signal lines. The current through the switch will reduce first and second driving currents which need to be applied to the first and second signal lines, respectively. If no current were caused through the switch between the first and second signal lines, the first and second signal lines need to be transitioned by the first and second driving currents alone without any short-circuit current. The current through the switch will cooperate with the first and second driving currents to transition the first and second signal lines. The switch between the first and second signal lines will reduce the necessary driving power to drive the first and second signal lines with applications of the first and second driving currents. It will be more effective to provide the switch between the first and second signal lines if at least one of the first and second signal lines has a larger load which needs a larger current consumption. It will also be more effective to provide the switch if the driving current for driving at least one of the first and second signal lines is supplied by a boosted power voltage.

In some cases, the switch temporary and electrically connects the first and second lines to each other, to cause a current through the switch between the first and second signal lines, in response to a first transition of the first signal line from a first level to a second level. The current promotes the first transition. The current causes a second transition of the second signal line from the second level to the first level.

In some cases, the switch temporary and electrically connects the first and second lines to each other, to cause a current through the switch between the first and second signal lines. The current promotes the first and second lines to be transitioned to the second and first levels respectively.

In some cases, the switch electrically connects the first and second lines to each other within a predetermined time period. The switch electrically disconnects the first and second lines from each other, after the predetermined time period has passed.

In some cases, the switch temporary and electrically connects the first and second lines to each other in response to a first transition signal to transition the semiconductor device between a stand-by state and an active state.

In some cases, the semiconductor device may further include, but is not limited to, a first control signal generator that generates a first control signal in response to a first transition signal to transition the semiconductor device between a stand-by state and an active state. The first control signal causes the switch to electrically connect the first and second lines to each other. The first control signal is a one-shot pulse signal. The first control signal generator receives, as the first transition signal, a memory mat selecting signal which selects one of memory mats, the first control signal generator generates the first control signal in response to the memory mat selecting signal.

In some cases, at least one of the first and second levels is equal to a boosted voltage level which is boosted from a power voltage.

In some cases, the semiconductor device may further include, but is not limited to, a plurality of memory mats; a sense amplifier shared by the plurality of memory mats; a plurality of precharge circuits, each of the plurality of precharge circuits precharging bit lines of a corresponding one of the plurality of memory mats; and a shared circuit connecting the sense amplifier to bit lines of a selected one of the plurality of memory mats. The first signal line transmits a precharge signal that controls the precharge circuit. The second signal line transmits a shard signal that controls the shared circuit.

In some cases, the shared circuit comprises a plurality of shared units, and the shard signal exclusively selects one of the shared units and non-selects other of the shared units.

In another embodiment, a device may include, but is not limited to, a memory mat comprising first and second bit lines; an amplifier circuit coupled to the first and second bit lines; a control portion generating first and second signals; and first and second signal lines supplied respectively with the first and second signals. The first and second bit lines is electrically coupled to each other during a first time period in which the first signal takes a first logic level and the second signal takes a second logic level. The first and second bit lines is electrically decoupled from each other during a second time period in which the first signal takes the second logic level and the second signal takes the first logic level. The first and second bit lines are electrically decoupled from the amplifier circuit during the first time period. The first and second bit lines are electrically coupled to the amplifier circuit during the second time period. The first and second signal lines are electrically coupled to each other during a third period in at least one of the first and second time periods from a timing when at least one of the first and second signals change from one of the first and second logic level to the other thereof.

In some cases, the first and second signal lines are electrically decoupled from each other during a remaining time period in the first and second time periods.

In some cases, the device may further include a first switch portion coupled between the first bit lines and the second bit lines and controlled by the first signal; a second switch portion coupled between the amplifier circuit and the first and second bit lines and controlled by the second signal; and a third switch portion coupled between the first signal line and the second signal line and controlled by the third signal.

In some cases, the first signal line is connected between the control portion and the first switch portion. The second signal line is connected between the control portion and the second switch portion.

The control portion may include, but is not limited to, a signal generating circuit generating an one shot pulse signal having a pulse width that is substantially equal in time to the third time period in response to a transition of at least one of the first and second signals from one of the first and second logic level to the other thereof, and supplying the one shot pulse signal to the third switch portion so as to control the third switch circuit.

In still another embodiment, a method of controlling signal lines may include, but is not limited to, temporary causing a short-circuit current between first and second lines, when the first signal line is transitioned from a first level to a second level while the second signal line is transitioned from the second level to the first level.

In some cases, temporary causing the short-circuit current may include, but is not limited to, temporary turning a switch into a conductive state between the first and second lines in a predetermined time period, in response to a first transition of the first signal line from a first level to a second level. The first short-circuit current promotes the first transition. The first short-circuit current causes a second transition of the second signal line from the second level to the first level. The switch is turned into a non-conductive state after the first predetermined time period has passed.

In some cases, temporary causing the first short-circuit current may include, but is not limited to, temporary turning a switch into a conductive state between the first and second lines in a predetermined time period. The first short-circuit current promotes the first and second lines to be transitioned to the second and first levels respectively. The switch is turned into a non-conductive state after the first predetermined time period has passed.

In some cases, at least one of the first and second levels is equal to a boosted voltage level which is boosted from a power voltage.

In some cases, the method may include, but is not limited to, temporary causing a second short-circuit current between the first and second lines, when the first signal line is transitioned from the second level to the first level while the second signal line is transitioned from the first level to the second level. Temporary causing the second short-circuit current is different in timing from temporary causing the first short-circuit current.

Embodiments

Figure 1:
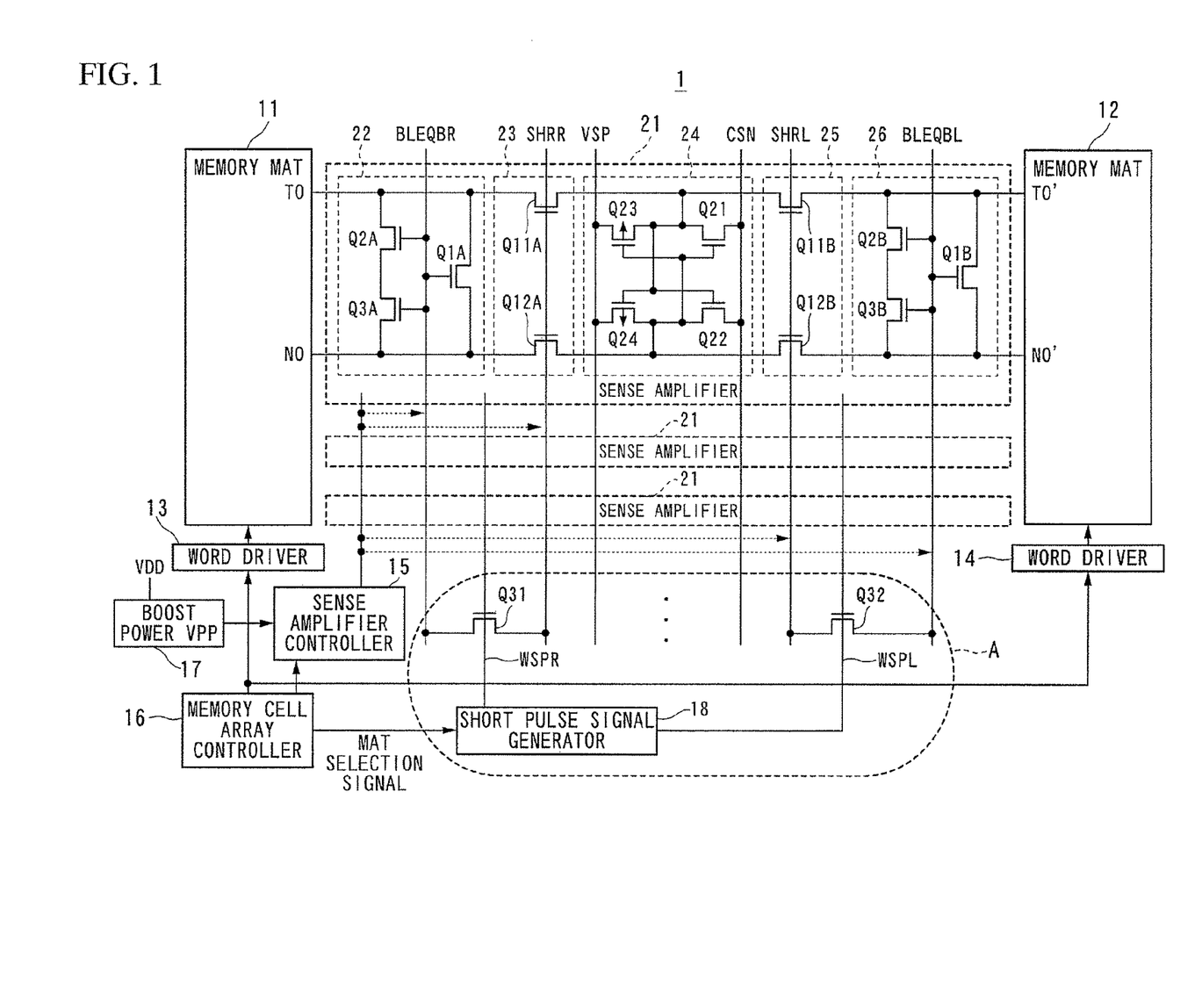
FIG. 1 is a diagram illustrating the configuration of a semiconductor memory device according to the embodiment of the invention.

FIG. 1 is a diagram illustrating the configuration of a semiconductor memory device according to the embodiment of the invention.

When compared to a semiconductor memory device 1A of the related art shown in FIG. 3, a semiconductor memory device 1 shown in FIG. 1 has the same basic constituent parts, but is different in the point that shorting transistors Q31 and Q32, and a short pulse signal generating section 18 are added which are surrounded by the dashed line A in the drawing. Since other constituent parts such as a memory mat 11, a sense amplifier circuit 21, and a peripheral control section have the same configurations as those shown in FIG. 3, like numbers reference like elements, and duplicated description is omitted.

In FIG. 1, the shorting transistors Q31 and Q32 are N-channel MOS transistors used as a switch element. The shorting transistor Q31 is a switch element for shorting (short-circuiting) a signal line of a bit line precharge signal BLEQBR that controls a precharge section 22, and a signal line of a shared signal SHRR that controls a shared section 23.

The shorting transistor Q32 is a switch element for shorting a signal line of a bit line precharge signal BLEQBL that controls a precharge section 26, and a signal line of a shared signal SHRL that controls a shared section 25.

As described above, the bit line precharge signals BLEQBR and BLEQBL, and the shared signals SHRR and SHRL are signals generated by a sense amplifier control section 15, and are signals of the signal levels are generated by a voltage level of a boosting power supply VPP.

The shorting transistors Q31 and Q32 may be disposed in a memory cell array control section 16, or the sense amplifier control section 15. Alternatively, they may be disposed in a crossing portion and the like of rows of word drivers 13 and 14, and the sense amplifier circuit 21. That is, they may be disposed so as to raise the area efficiency while keeping an area on a semiconductor substrate effective.

A short pulse signal WSPR to be output from the short pulse signal generating section 18 is input to a gate of the shorting transistor Q31. The short pulse signal WSPL to be output from the short pulse signal generating section 18 is input to a gate of the shorting transistor Q32. The short pulse signals WSPR and WSPL are signals generated on the basis of a memory mat selection signal and the like to be input from the memory cell array control section 16 in the short pulse signal generating section 18.

Figure 2A:
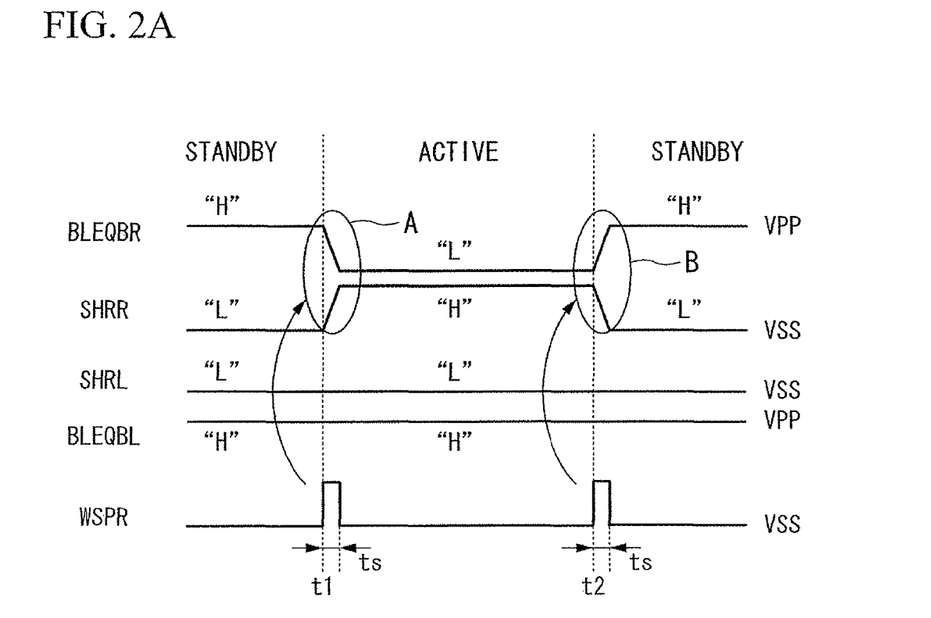
FIG. 2A is a timing chart illustrating waveforms of signals to describe operations of a sense amplifier circuit when data are read out from a memory cell included in a first memory mat in the semiconductor memory device shown in FIG. 1.
Figure 2B:
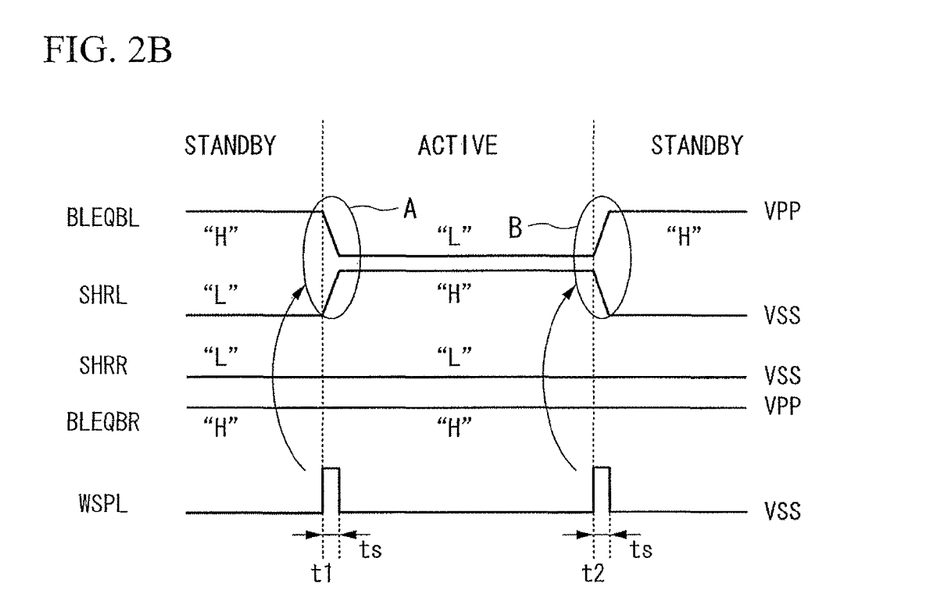
FIG. 2B is a timing chart illustrating waveforms of signals to describe operations of a sense amplifier circuit when data are read out from a memory cell within a second memory mat in the semiconductor memory device shown in FIG. 1.

FIGS. 2A and 2B are diagrams for describing an operation of the semiconductor memory device 1 of the embodiment. FIG. 2A is a timing chart illustrating waveforms of signals to describe operations of the sense amplifier circuit 21 when data are read out from a memory cell included in the memory mat 11 in the semiconductor memory device 1 shown in FIG. 1. FIG. 2B is a timing chart illustrating waveforms of signals to describe operations of the sense amplifier circuit 21 when data are read out from a memory cell within the memory mat 12 in the semiconductor memory device 1 shown in FIG. 1.

In the timing chart of FIG. 2A, shown, in order from above, are the bit line precharge signal BLEQBR to be input to the precharge section 22, the shared signal SHRR to be input to shared section 23, the shared signal SHRL to be input to the shared section 25, the bit line precharge signal BLEQBL to be input the precharge section 26, and the short pulse signal WSPR which becomes a gate input signal of the shorting transistor Q31. Meanwhile, in the signal levels of the signals shown in FIG. 2A, "H" level (simply referred to as "H") is a signal of the voltage level VPP of the boosting power supply VPP, and "L" level (simply referred to as "L") is a signal of the level of a ground voltage VSS.

The operation in the sense amplifier circuit 21 will be described with reference to the timing chart of FIG. 2A.

In FIG. 2A, at the standby period (before t1) before time t1, the bit line precharge signal BLEQBR is maintained in an "H" state, the bit-line precharge signal BLEQBL is maintained in an "H" state, and the shared signals SHRR and SHRL are maintained in an "L" state.

Meanwhile, in the related art, as shown in a timing chart of the related art of FIG. 4, the shared signal SHRR is maintained in an "H" level at the standby period before time t1, but in the case of the embodiment shown in FIG. 2A, the shared signal SHRR is shown in which logic is replaced so as to be maintained in an "L" level. This is to enable reallocation of charges to be performed between the signal line of the bit line precharge signal BLEQBR and the signal line of the shared signal SHRR by the shorting transistor Q31 described later. That is, this is to transit the bit line precharge signal BLEQBR and the shared signal SHRR to the reverse logic level of "H" or "L".

At time t1, a command (Active command) for activating the memory mat 11 is issued from the memory cell array control section 16 to the sense amplifier control section 15. In addition, the word driver 13 is activated as well.

The sense amplifier control section 15 is activated by the Active command, and the sense amplifier circuit 21 enters the active period (time t1 to time t2) for reading out data of the memory cell within the memory mat 11 from time t1.

When the sense amplifier circuit enters the active period (time t1 to time t2) at time t1, the bit-line precharge signal BLEQBR is transited from "H" to "L", and the shared signal SHRR is transited from "L" to "H". That is, the bit-line precharge signal BLEQBR and the shared signal SHRR is transited in a direction of the reverse logic level (see a portion surrounded by circle A in the drawing). In the meantime, the shared signal SHRL remains "L", and the bit-line precharge signal BLEQBL remains "H".

Herewith, at the active period (time t1 to time t2), precharge states of the bit lines T0 and N0 in the precharge section 22 of the memory mat 11 side are released. In addition, the bit lines T0 and N0 of the memory mat 11 side and the sense amplifier section 24 are connected via the shared section 23. Herewith, a signal of the memory cell selected by the word driver 13 within the memory mat 11 is read out by the sense amplifier section 24 through the bit lines T0 and N0.

On the other hand, the precharge section 26 of the memory mat 12 side and the sense amplifier section 24 remain separated by the shared section 25. In addition, the word driver 14 is not activated either.

In this case, as shown in the timing chart of FIG. 2A, the short pulse signal WSPR is generated at time t1 by the short pulse signal generating section 18. The shorting transistor Q31 is turned on only for a period of short time ts from time t1 in response to the short pulse signal WSPR. The shorting transistor Q31 is turned on, so that the signal line of the bit line precharge signal BLEQBR and the signal line of the shared signal SHRR are shorted only for a period of short time ts from time t1.

Just after time t1, the bit line precharge signal BLEQBR remains an "H" level, and the shared signal SHRR remains an "L" level (see a portion surrounded by circle A). For this reason, when the shorting transistor Q31 is turned on, a short-circuit current flows from the signal line of the bit line precharge signal BLEQBR which is an "H" level toward the signal line of the shared signal SHRR which is an "L" level. The short-circuit current flows so as to drop a voltage of the signal line of the bit-line precharge signal BLEQBL and raise a voltage of the signal line of the shared signal SHRL, to thereby cause reallocation of charges (+charges) to be performed between two signal lines.

That is, since the bit-line precharge signal BLEQBR is transited from "H" to "L", and the shared signal SHRR is transited from "L" to "H", the reallocation of charges acts in a direction where variation in the signal voltages in each bit-line precharge signal BLEQBR and shared signal SHRR is promoted. In this manner, it is possible to effectively use charges held in the bit line precharge signal BLEQBR by performing the reallocation of charges. Herewith, drive currents of the signal lines of the bit line precharge signal BLEQBR and the shared signal SHRR are reduced, to thereby allow power consumption in the boosting power supply VPP to be reduced Subsequently, when readout of data from the memory cell of the memory mat 11 is completed, and time t2 is reached, the Precharge command is issued from the memory cell array control section 16 to the sense amplifier control section 15. By issuing this Precharge command, after time t2, the sense amplifier circuit 21 enters the standby period (after time t2) for precharging the bit line T0 and N0 of the memory mat 11.

When the sense amplifier circuit enters the standby period (after time t2) at time t2, the bit-line precharge signal BLEQBR is transited from "L" to "H", and the shared signal SHRR is transited from "H" to "L". That is, the bit-line precharge signal BLEQBR and the shared signal SHRR are transited in a direction of the reverse logic level (see a portion surrounded by circle B in the drawing). Meanwhile, the shared signal SHRL remains "L", and the bit-line precharge signal BLEQBL remains "H".

At the standby period (after time t2), the precharge section 22 starts precharge of the bit lines T0 and N0, and the shared section 23 separates connection of the bit line T0 and N0 and the sense amplifier section 24.

In this case, as shown in the timing chart of FIG. 2A, the short pulse signal generating section 18 generates the short pulse signal WSPR at time t2. The shorting transistor Q31 is turned on only for a period of short time ts from time t2 in response to the short pulse signal WSPR. By turning on the shorting transistor Q31, the signal line of the bit line precharge signal BLEQBR and the signal line of the shared signal SHRR are shorted only for a period of short time ts from time t2.

Just before time t2, the bit-line precharge signal BLEQBR remains "L", and the shared signal SHRR remains "H" (see a portion surrounded by circle B in the drawing). For this reason, the short-circuit current flows from the signal line of the shared signal SHRR toward the signal line of the bit-line precharge signal BLEQBR. The short-circuit current flows so as to raise a voltage of the signal line of the bit-line precharge signal BLEQBL and decrease a voltage of the signal line of the shared signal SHRL, to thereby cause reallocation of charges (+charges) to be performed between two signal lines.

That is, since the bit-line precharge signal BLEQBR is transited from "L" to "H", and the shared signal SHRR is transited from "H" to "L", it is possible to effectively use the charges (+charges) held in the shared signal SHRR by this reallocation of charges. Herewith, even in the case of transition to the standby period (after time t2), the drive currents of the signal lines of the bit-line precharge signal BLEQBR and the shared signal SHRR are reduced, to thereby allow power consumption in the boosting power supply VPP to be reduced.

Meanwhile, FIG. 2B is a timing chart for describing an operation in the sense amplifier circuit 21 when data of the memory cell of the memory mat 12 side are read out. The timing chart shown in FIG. 2B shows that compared to that of FIG. 2A, logics of the bit-line precharge signals BLEQBR and BLEQBL replace each other with respect to the bit-line precharge signal, logics of the shared signals SHRR and SHRL replace each other with respect to the shared signal, and the short pulse signal WSPR is replaced by WSPL. Since the basic operation thereof is the same as that of FIG. 2A, the description thereof is omitted.

As shown in FIG. 2B, even in the memory mat 12 side, at the transition (see a portion surrounded by circle A in the drawing) to the active period in time t1, and at the transition (see a portion surrounded by circle B in the drawing) to the standby period in time t2, the shorting transistor Q32 is shorted only for time ts. Herewith, reallocation of charges is performed between the bit line precharge signal BLEQBL and the shared signal SHRL, to thereby allow the charges held in the bit line precharge signal BLEQBL and the shared signal SHRL to be effectively used by this reallocation of charges. Herewith, the drive currents of the signal lines of the bit line precharge signal BLEQBL and the shared signal SHRL are reduced, to thereby allow power consumption in the boosting power supply VPP to be reduced.

As described above, in the semiconductor memory device 1 shown in FIG. 1, at the transition from the standby period (before time t1) to the active period (time t1 to time t2) in the sense amplifier circuit 21, and at the transition from the active period (time t1 to time t2) to the standby period (after time t2), the short pulse signals WSPR and WSPL are generated by the short pulse signal generating section 18.

In the memory mat 11 side, at the signal transition, by turning on the shorting transistor Q31 in response to the short pulse signal WPSR, the signal line of the bit-line precharge signal BLEQBR and the signal line of the shared signal SHRR are shorted only for short time ts, and the short-circuit current is caused to flow, to thereby cause the reallocation of charges to be performed.

Simultaneously, in the memory mat 12 side, at the signal transition, by turning on the shorting transistor Q32 in response to the short pulse signal WPSL, the signal line of the bit-line precharge signal BLEQBL and the signal line of the shared signal SHRL are shorted only for short time ts, and the short-circuit current is caused to flow, to thereby cause the reallocation of charges to be performed.

Herewith, the current flowing into the signal lines of the bit line precharge signals BLEQBR and BLEQBL, and the shared signals SHRR and SHRL is reduced, to thereby allow power consumption in the boosting power supply VPP to be reduced. For example, there may also be a case where power consumption in the bit line precharge signals BLEQBR and BLEQBL, and the shared signals SHRR and SHRL can be reduced by about 50%.

Meanwhile, there is a concern that an area of the semiconductor substrate is increased by adding the shorting transistors Q31 and Q32. However, with respect to this point, the shorting transistors Q31 and Q32 can be disposed in the crossing portion and the like of rows of the memory cell array control section 16, or the word drivers 13 and 14, and the sense amplifier circuit 21, as described above. That is, they may be disposed so as to raise the area efficiency while keeping an area on a semiconductor substrate effective.

As described above, in the semiconductor memory device 1 of the embodiment, at the signal transition (for example, at the signal transition from the standby period to the active period in the sense amplifier circuit 21), the first signal line (signal line of the bit-line precharge signal BLEQBR), and the second signal line (signal line of the shared signal SHRR) transited to the reverse signal levels of an "H" level or an "L" level, respectively, are configured to include a switch element (shorting transistor Q31) for performing a short-circuit operation for a predetermined time from the signal transition.

At the signal transition of the first signal line (signal line of the bit-line precharge signal BLEQBR) and the second signal line (signal line of the shared signal SHRR), the short current can be caused to flow between the first signal line and the second signal line, to thereby allow the reallocation of charges to be performed mutually. For this reason, it is possible to diminish the current flowing into the first signal line and the second signal line, and to reduce power consumption by the first signal line and the second signal line. Thus, it is possible to reduce power consumption of the power supply for driving the signal lines. In particular, when the signal line is a signal line of a heavy load with large current consumption, or when the boosting power supply with inefficient current consumption is used for driving the signal line, it is possible to effectively reduce power consumption.

The semiconductor memory device 1 of the embodiment includes the boosting power supply VPP for generating a power-supply voltage boosted from the externally-supplied power supply VDD, and includes the first signal line (signal line of the bit-line precharge signal BLEQBR), and the second signal line (signal line of the shared signal SHRR) transited to the reverse signal levels of an "H" level or an "L" level, respectively, at the signal transition (for example, signal transition from the standby period to the active period in the sense amplifier circuit 21). The signals of the first signal line and the second signal line are configured to be generated as signals of the voltage levels of the boosting power supply VPP.

It is possible to perform control (ROW-based control) by the first signal line (signal line of the bit line precharge signal BLEQBR) and the second signal line (signal line of the shared signal SHRR) at high speed, and to perform the reallocation of charges mutually by causing the short current to flow between the first signal line and the second signal line. For this reason, it is possible to diminish the current flowing into the first signal line and the second signal line, and to reduce power consumption by the first signal line and the second signal line. Thus, it is possible to reduce power consumption of the boosting power supply VPP for driving the first signal line and the second signal line.

The semiconductor memory device 1 of the embodiment includes a plurality of memory mats 11 and 12, and the shared type sense amplifier circuit 21. Further, the sense amplifier circuit 21 includes the sense amplifier section 24 shared by a plurality of memory mats 11 and 12, the precharge sections 22 and 26, provided for each memory mat of a plurality of memory mats 11 and 12, that precharge the bit lines T0 and N0 (and T0' and N0') of the corresponding memory mat, the shared sections 23 and 25, disposed between the precharge sections 22 and 26 and the sense amplifier section 24, that connect the bit lines T0 and N0 (or T0' and N0') of the selected memory mat within the memory mats 11 and 12 and the sense amplifier section 24, the first signal lines which are the bit line precharge signals BLEQBR and BLEQBL for controlling the precharge sections 22 and 26, and the second signal lines which are the shared signals SHRR and SHRL for controlling the shared sections 23 and 25.

In the above-mentioned configuration, at the signal transition within the sense amplifier circuit 21 (transition from the standby period to the active period, or, transition from the active period to the standby period), the short-circuit current is caused to flow by the switch elements (shorting transistors Q31 and Q32) between the signal line of the bit line precharge signal BLEQBR which is the first signal line, and the signal line of the shared signal SHRR which is the second signal line, or between the signal line of the bit line precharge signal BLEQBL, and the signal line of the shared signal SHRR, to thereby cause the reallocation of charges to be performed mutually.

It is possible to diminish the current flowing into the signal lines of the bit line precharge signals BLEQBR and BLEQBL, and the signal lines of the shared signals SHRR and SHRL. Thus, it is possible to reduce the supply of power of the power supply for driving the signal lines.

The term "configured" is used to describe a component, section or part of a device includes hardware and/or software that is constructed and/or programmed to carry out the desired function.

It is apparent that the present invention is not limited to the above embodiments, but may be modified and changed without departing from the scope and spirit of the invention.

What is claimed is:

1. A semiconductor device comprising:
   a first signal line supplied with a first signal, the first signal taking a first logic level during a first period of time, changing from the first logic level to a second logic level during a second period of time that follows the first period of time, and taking the second logic level during a third period of time that follows the second period of time;
   a second signal line supplied with a second signal, the second signal taking the second logic level during the first period of time, changing from the second logic level to the first logic level during the second period of time, and taking the first logic level during the third period of time; and
   a switch coupled between the first and second lines,
   wherein the switch connects the first and second signal lines to each other during the second period of time and disconnects the first and second signal lines from each other during both of the first period of time and the third period of time.

2. The semiconductor device according to claim 1, wherein when the switch connects the first and second signal lines to each other, a current through the switch between the first and second signal lines is caused, to promote a first transition of the first signal line from the first logic level to the second logic level, and to cause a second transition of the second signal line from the second logic level to the first logic level.

3. The semiconductor device according to claim 1, wherein when the switch connects the first and second signal lines to each other, a current through the switch between the first and second signal lines is caused to promote the first and second signal lines to be transitioned to the second and first logic levels respectively.

4. The semiconductor device according to claim 1, wherein the switch temporary and electrically connects the first and second lines to each other in response to a first transition signal that is generated in response to transition of the semiconductor device between a stand-by state and an active state.

5. The semiconductor device according to claim 1, further comprising:
   a first control signal generator that generates a first control signal in response to a first transition signal to transition the semiconductor device between a stand-by state and an active state, the first control signal causing the switch to electrically connect the first and second lines to each other.

6. The semiconductor device according to claim 5, wherein the first control signal is a one-shot pulse signal.

7. The semiconductor device according to claim 5, wherein the first control signal generator receives, as the first transition signal, a memory mat selecting signal which selects one of memory mats, the first control signal generator generates the first control signal in response to the memory mat selecting signal.

8. The semiconductor device according to claim 1, further comprising:
   a plurality of memory mats;
   a sense amplifier shared by the plurality of memory mats;
   a plurality of precharge circuits, each of the plurality of precharge circuits precharging bit lines of a corresponding one of the plurality of memory mats; and
   a shared circuit connecting the sense amplifier to bit lines of a selected one of the plurality of memory mats,
   wherein the first signal line transmits a precharge signal that controls the precharge circuit,
   the second signal line transmits a shared signal that controls the shared circuit.

9. The semiconductor device according to claim 8, wherein the shared circuit comprises a plurality of shared units, and the shared signal exclusively selects one of the shared units and non-selects other of the shared units.

10. A device comprising:
    first and second bit lines;
    and amplifier coupled to the first and second bit lines;
    a first transistor coupled between the first bit line and the amplifier, the first transistor connecting, when rendered conductive, the first bit line to the amplifier and disconnecting, when rendered nonconductive, the first bit line from the amplifier;
    a second transistor coupled between the second bit line and the amplifier, the second transistor connecting, when rendered conductive, the second bit line to the amplifier and disconnecting, when rendered nonconductive, the second bit line from the amplifier;
    a first signal line coupled to supply a first signal in common to control the electrode of the first and second transistors, the first and the second transistors being conductive when the first signal takes a first logic level and being nonconductive when the first signal takes a second logic level, the first signal starting changing from one of the first and the second logic levels to the other of the first and the second logic levels at a first timing;
    a first precharge circuit coupled between the first and second bit lines;
    a second signal line coupled to supply a second signal to the first precharge circuit, the first precharge circuit connecting the first and second bit lines to each other when the second signal takes the first logic level and disconnecting the first and second bit lines from each other when the second signal takes the second logic level, the second signal starting changing from the other of the first and the second logic levels to the one of the first and the second logic levels at the first timing; and
    a third transistor coupled between the first and the second signal lines and connecting the first and the second signal line to each other in a first period of time from the first timing.

11. The device as claimed in claim 10, wherein the third transistor disconnects the first and the second signal lines during a second period of time when the first signal maintains one of the first and the second logic levels.

12. The device as claimed in claim 10, wherein the third transistor disconnects the first and the second signal lines during a second period of time when the signal line maintains one of the first and the second logic levels.

13. The device as claimed in claim 10, further comprising:
third and fourth bit lines;
a fourth transistor coupled between the third bit line and the amplifier, the fourth transistor connecting, when rendered conductive, the third bit line to the amplifier and disconnecting, when rendered nonconductive, the third bit line from the amplifier;
a fifth transistor coupled between the fourth bit line and the amplifier, the fifth transistor connecting, when rendered conductive, the fourth bit line to the amplifier and disconnecting, when rendered nonconductive, the fourth bit line from the amplifier;
a third signal line coupled to supply a third signal in common to control the electrode of the fourth and the fifth transistors, the fourth and the fifth transistors being conductive when the third signal takes a third logic level and being nonconductive when the third signal takes a fourth logic level, the third signal starting changing from one of the third and the fourth logic levels to the other of the third and the fourth logic levels at a second timing;
a second precharge circuit coupled between the third and fourth bit lines;
a fourth signal line coupled to supply a fourth signal to the second precharge circuit, the second precharge circuit connecting the third and fourth bit lines to each other when the fourth signal takes the third logic level and disconnecting the third and fourth bit lines from each other when the fourth signal takes the fourth logic level, the fourth signal starting changing from the other of the third and the fourth logic levels to the one of the third and the fourth logic levels at the second timing; and
a six transistor coupled between the third and the fourth signal lines and connecting the third and the fourth signal line to each other in a second period of time from the first timing.

14. The device as claimed in claim 13, wherein the first logic level is equal to the third logic level and the second logic level is equal to the fourth logic level.

15. A device comprising:
first and second bit lines;
an amplifier circuit including first and second nodes;
a first transistor coupled between the first bit line and the first node of the amplifier;
a second transistor coupled between the second bit line and the second node of the amplifier;
a first signal line coupled to supply a first signal in common to control electrodes of the first and the second transistors;
a first precharge circuit coupled between the first and second bit lines;
a second signal line coupled to supply a second signal to the first precharge circuit; and
a third transistor coupled between the first and the second signal lines and configured to operatively short-circuit the first and the second signal lines to each other.

16. The device as claimed in claim 15, wherein the amplifier further includes third and fourth nodes, and the device further comprises:
third and fourth bit lines;
a fourth transistor coupled between the third bit line and the third node of the amplifier;
a fifth transistor coupled between the fourth bit line and the fourth node of the amplifier;
a third signal line coupled to supply a third signal in common to control electrodes of the fourth and the fifth transistors;
a second precharge circuit coupled between the third and fourth bit lines;
a fourth signal line coupled to supply a fourth signal to the second precharge circuit; and
a sixth transistor coupled between the third and the fourth signal lines and configured to operatively short-circuit the third and the fourth signal lines to each other.

* * * * *